(12) United States Patent
Abe (10) Patent No.: US 11,910,528 B2
(45) Date of Patent: Feb. 20, 2024

(54) ELECTRONIC DEVICE

(71) Applicant: Japan Display Inc., Tokyo (JP)

(72) Inventor: Hideaki Abe, Tokyo (JP)

(73) Assignee: Japan Display Inc., Tokyo (JP)

(*) Notice: Subject to any disclaimer, the term of this patent is extended or adjusted under 35 U.S.C. 154(b) by 233 days.

(21) Appl. No.: 17/577,435

(22) Filed: Jan. 18, 2022

(65) Prior Publication Data

US 2022/0141957 A1 May 5, 2022

Related U.S. Application Data

(63) Continuation of application No. PCT/JP2020/025403, filed on Jun. 26, 2020.

(30) Foreign Application Priority Data

Jul. 19, 2019 (JP) ................... 2019-133915

(51) Int. Cl.
*H02H 1/00* (2006.01)
*H05K 1/11* (2006.01)
*H05K 1/14* (2006.01)

(52) U.S. Cl.
CPC ............. *H05K 1/118* (2013.01); *H05K 1/147* (2013.01); *H05K 2201/10128* (2013.01)

(58) Field of Classification Search
None
See application file for complete search history.

(56) References Cited

U.S. PATENT DOCUMENTS

| 6,411,359 | B1 | 6/2002 | Kobayashi et al. | |
|---|---|---|---|---|
| 9,084,368 | B2* | 7/2015 | Tsai | H05K 1/189 |
| 11,064,622 | B2* | 7/2021 | Chen | H05K 7/04 |
| 2008/0088768 | A1 | 4/2008 | Kohno | |
| 2012/0134122 | A1* | 5/2012 | Kim | H05K 1/189 |
| | | | | 156/273.9 |
| 2013/0148312 | A1 | 6/2013 | Han et al. | |
| 2016/0100486 | A1 | 4/2016 | Chen et al. | |

(Continued)

FOREIGN PATENT DOCUMENTS

| JP | 2000-187452 A | 7/2000 |
|---|---|---|
| JP | 2018-93101 A | 6/2018 |

OTHER PUBLICATIONS

International Search Report dated Sep. 8, 2020 for PCT Application PCT/JP2020/025403, with English translation.

(Continued)

*Primary Examiner* — Stephen W Jackson
(74) *Attorney, Agent, or Firm* — Michael Best & Friedrich LLP (57) ABSTRACT

According to one embodiment, an electronic device includes a panel, a circuit board, a first flexible wiring board, and a first IC chip. The panel includes a curved display surface, a mounting portion curved, and a plurality of first pads disposed at intervals on the mounting portion. The circuit board is a plate-like. The first flexible wiring board has a first end portion mounted on the plurality of first pads and a second end portion connected to the circuit board. The first IC chip is mounted on the mounting portion and electrically connected to the first flexible wiring board. A first center of the first flexible wiring board is closer to a third center of the panel than a second center of the first IC chip in plan view.

10 Claims, 8 Drawing Sheets

(56) References Cited

U.S. PATENT DOCUMENTS

2016/0178952 A1    6/2016    Katagiri et al.
2016/0219706 A1    7/2016    Jo et al.
2020/0100361 A1*  3/2020    Chen ..................... H05K 1/147

OTHER PUBLICATIONS

Japanese Office Action dated Feb. 21, 2023 for the corresponding Japanese Patent Application No. 2019-133915, with machine English translation provided by the Global Dossier.
Chinese Office Action dated Mar. 1, 2023 for the corresponding Chinese Patent Application No. 202080047960.7.
Office Action dated Jul. 28, 2023 for Chinese Application No. 202080047960.7.

* cited by examiner

ELECTRONIC DEVICE

CROSS-REFERENCE TO RELATED APPLICATIONS

This application is a Continuation Application of PCT Application No. PCT/JP2020/025403, filed Jun. 26, 2020 and based upon and claiming the benefit of priority from Japanese Patent Application No. 2019-133915, filed Jul. 19, 2019, the entire contents of all of which are incorporated herein by reference.

FIELD

Embodiments described herein relate to an electronic device.

BACKGROUND

In various electronic devices such as a smartphone, a tablet terminal, and a car navigation system, in many cases, a circuit board to which a flexible wiring board is connected is disposed on the back side of the operation surface. In a display device as an example of an electronic device, the number and types of flexible wiring boards to be used tend to increase along with recent high definition and increase in variations in shape, and development for the purpose of commonality of flexible wiring boards has been conducted. On the other hand, for example, in a display device having a curved display surface, since one end of the flexible wiring board is connected to a curved display panel and the other end is connected to a plate-like circuit board, there is a problem that stress is applied to the flexible wiring board itself.

DETAILED DESCRIPTION

In general, according to one embodiment, an electronic device comprises a panel including a curved display surface, a mounting portion curved along with a curved surface shape of the display surface, and a plurality of first pads disposed at intervals on the mounting portion in a first direction, a plate-like circuit board, a first flexible wiring board having a first end portion mounted on the plurality of first pads and a second end portion opposite to the first end portion and connected to the circuit board, and a first IC chip mounted on the mounting portion and electrically connected to the first flexible wiring board. A first center of the first flexible wiring board in the first direction is closer to a third center of the panel in the first direction than a second center of the first IC chip in the first direction in plan view.

According to such a configuration, it is possible to provide an electronic device capable of improving reliability.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Figure 1:
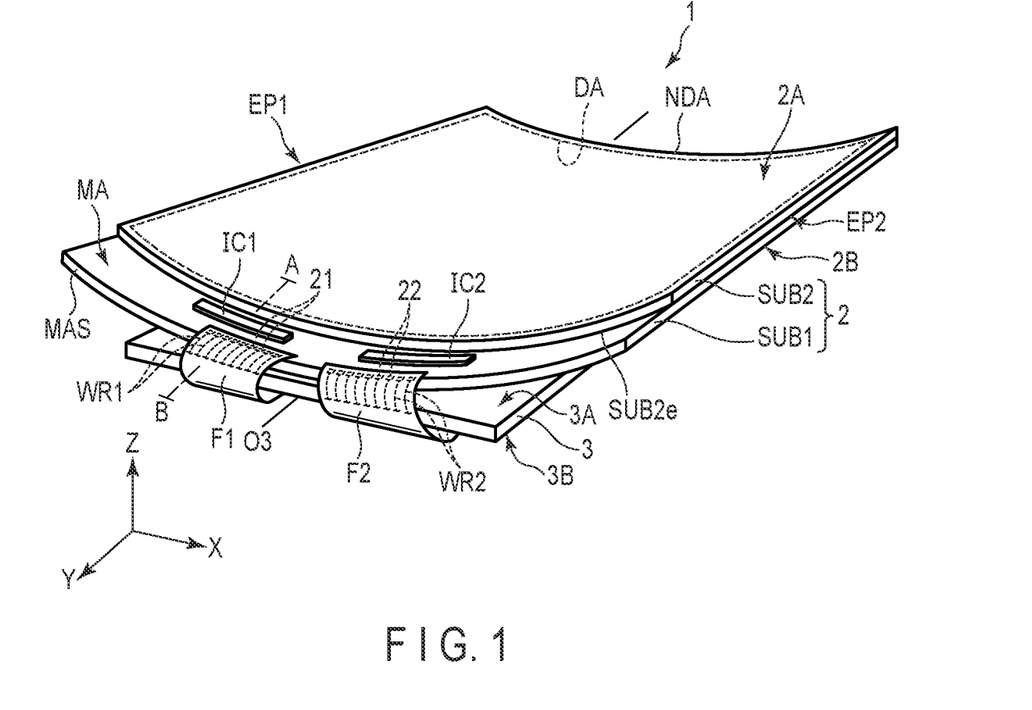
FIG. 1 is a perspective view illustrating a display device 1 of the present embodiment.

FIG. 1 is a plan view schematically showing a display device 1 according to this embodiment. The main configuration of this embodiment can be used for electronic devices including a flexible wiring substrate. In particularly, this embodiment is applicable to such a type that a flexible wiring substrate is mounted on a curved surface.

In the following descriptions, a display device is described as an example of the electronic device. The display device can be used in, for example, various types of equipment such as smartphones, tablet terminals, mobile telephone terminals, laptop personal computers, TV receivers, in-car equipment and game consoles. The embodiments can also be applied to, a liquid crystal display device, a self-luminous display device such as an organic electroluminescent display device or micro-LED display device, an electronic paper display device comprising a cataphoretic element, and the like, a display device employing microelectromechanical systems (MEMS), or a display device employing electrochromism. Further, the application of the embodiments is not limited to the display devices listed above, but an example of the electronic device may be a touch panel substrate, a fingerprint sensor substrate or the like.

A first direction X, a second direction Y and a third direction Z in the figures are orthogonal to each other, but they may intersect at an angle other than 90 degrees. In the following descriptions, a direction forwarding a tip of an arrow indicating the third direction Z is referred to as "upward" and a direction forwarding oppositely from the tip of the arrow is referred to as "downward".

In the following descriptions, the third direction Z is defined as "upward" and a direction opposite to the third direction is defined as "downward". Further, with such expressions "a second member above a first member" and "a second member below a first member", the second member may be in contact with the first member or may be remote from the first member. Further, viewing from the tip of the arrow indicating the third direction to an X-Y plane defined by the first direction X and the second direction Y is referred to as planar view.

The display device 1 includes a display panel 2, a circuit board 3, an IC chip (first IC chip) IC1, an IC chip (second IC chip) IC2, a flexible wiring board (first flexible wiring board) F1, and a flexible wiring board (second flexible wiring board) F2.

The display panel 2 is, for example, an active-matrix liquid crystal display panel. The display panel 2 has end portions EP1 and EP2 extend along the second direction Y. A center position of the display panel 2 with respect to the width in the first direction X is defined as a center (third center) O3. That is, the center O3 is located at an equal distance from the end portions EP1 and EP2 in the first direction X. The display panel 2 has a display surface 2A for displaying an image and a surface 2B opposite to the display surface 2A. In the present embodiment, the display surface 2A and the surface 2B are curved. In an example, the display panel 2 is curved such that the end portions EP1 and EP2 are located above the position of the display surface 2A in the third direction Z at the center O3. Further, display panel 2 has a mounting side MAS curved along with the curved surface shape of display surface 2A.

The display panel 2 includes a first substrate SUB1 and a second substrate SUB2. The first substrate SUB1 and the second substrate SUB2 face each other in the third direction Z and are attached to each other. First substrate SUB1 and second substrate SUB2 are curved so as to form curved display surface 2A and surface 2B, respectively. The first substrate SUB1 and the second substrate SUB2 are each formed of a transparent insulating substrate such as a glass plate or a resin plate. The first substrate SUB1 includes mounting portion MA that does not overlap the second substrate SUB2. That is, the mounting portion MA corresponds to a portion between the end portion SUB2e of the second substrate SUB2 and the mounting side MAS. Similarly to the mounting side MAS, the mounting portion MA is curved along with the curved surface shape of the display surface 2A. The first substrate SUB1 includes a plurality of pads (first pads) 21 and a plurality of pads (second pads) 22 disposed along the mounting side MAS. In the present embodiment, the upper surface of the mounting side MAS is included in the display surface 2A. In the illustrated example, the display panel 2 is formed such that the width in the first direction X is larger than the width in the second direction Y. However, the width in the second direction Y may be larger than the width in the first direction X.

Display panel 2 includes a display region DA in which an image is displayed, and a non-display region NDA surrounding the display region DA. The display region DA is located in a region where the first substrate SUB1 and the second substrate SUB2 overlap, and includes a plurality of pixels (not illustrated). Here, the pixel is a minimum unit that can be individually controlled for the video signal. The non-display region NDA is located outside the display region DA and surrounds the display region DA in the illustrated example. The above-described mounting portion MA is included in the non-display region NDA.

The IC chips IC1 and IC2 function as a signal supply source that supplies a signal necessary for driving the display panel 2. The IC chips IC1 and IC2 are disposed on the mounting portion MA and are disposed in the first direction X. In the illustrated example, the IC chip IC1 is located closer to the end portion EP1 than the center O3, and the IC chip IC2 is located closer to the end portion EP2 than the center O3. In the second direction Y, the IC chip IC1 is located between the end portion SUB2e and the flexible wiring board F1. The IC chip IC2 is located between the end portion SUB2e and the flexible wiring board F2. The IC chip IC1 is electrically connected to the pad 21 by wiring (not illustrated), and the IC chip IC2 is electrically connected to the pad 22 by wiring (not illustrated).

The circuit board 3 has a flat plate shape, and has a surface 3A facing a surface 2B and a surface 3B opposite to the surface 3A. In the illustrated example, the surfaces 3A and 3B have a substantially rectangular shape and are parallel to the X-Y plane. For example, a communication module for communicating with the outside, a host device that controls the operation of the display device 1, and the like are mounted on the circuit board 3. In an example, the width of the circuit board 3 in the first direction X is smaller than the width of the display panel 2 in the first direction X, and the width of the circuit board 3 in the second direction Y is smaller than the width of the display panel 2 in the second direction Y.

The flexible wiring boards F1 and F2 are mounted on the mounting portion MA of the display panel 2 at one end, and are mounted on the circuit board 3 at the other end. In the illustrated example, the flexible wiring board F1 is located closer to the end portion EP1 than the center O3, and the flexible wiring board F2 is located closer to the end portion EP2 than the center O3. In the present embodiment, one flexible wiring board is connected to one IC chip. That is, the flexible wiring board F1 includes the plurality of wires WR1 connected to the pads 21, and electrically connects the IC chip IC1 and the circuit board 3. The flexible wiring board F2 has a plurality of wires WR2 connected to the pads 22, and electrically connects the IC chip IC2 and the circuit board 3.

Figure 2:
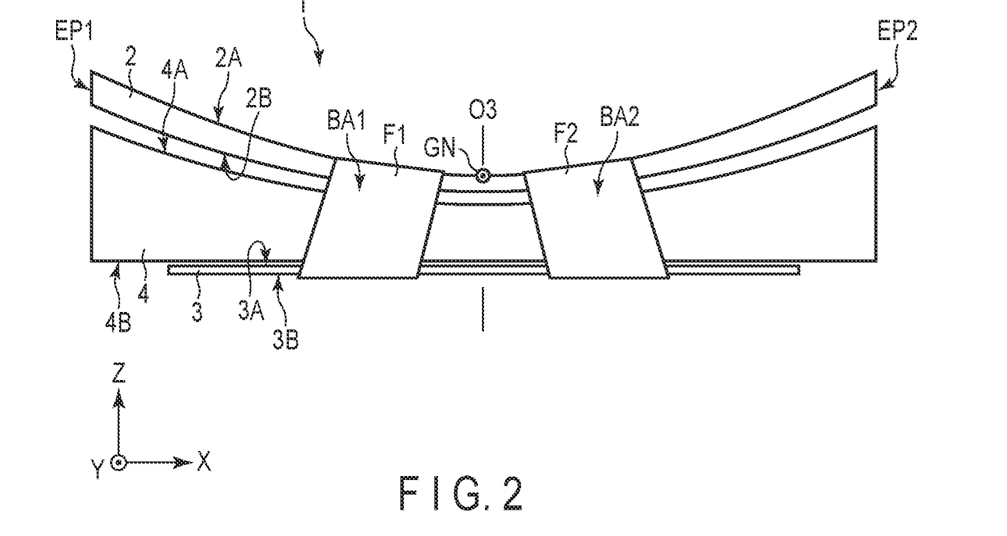
FIG. 2 is a side view of the display device 1 of the present embodiment.

FIG. 2 is a side view of the display device 1 of the present embodiment. FIG. 2 illustrates a plane parallel to an X-Z plane defined by the first direction X and the third direction Z. FIG. 2 is a side view of the display device 1 when viewed from the mounting side MAS side.

The display device 1 includes an illumination device 4 in addition to the above configuration. In the present embodiment, the display panel 2 has a transmissive display function of selectively transmitting light from the illumination device 4 to display an image. Note that the display device 1 may not necessarily include the illumination device, and the display panel 2 may be any of a transmissive type having a transmissive display function of selectively transmitting light from the lower surface of the first substrate SUB1 to display an image, a reflective type having a reflective display function of selectively reflecting light from the upper surface of the second substrate SUB2 to display an image, and a transflective type having the transmissive display function and the reflective display function. When the display device 1 does not include the illumination device, the illumination device 4 can be simply replaced with a casing 4 or a housing 4.

The illumination device 4 is located between the display panel 2 and the circuit board 3 and illuminates the display panel 2. The illumination device 4 has an upper surface 4A facing the surface 2B of display panel 2, and a lower surface 4B opposite to the upper surface 4A. The upper surface 4A is curved along the surface 2B of the display panel 2. The upper surface 4A corresponds to, for example, an upper surface of a light guide plate included in the illumination device 4. The lower surface 4B is flat and parallel to the surface 3A of the circuit board 3. The lower surface 4B corresponds to, for example, a bottom surface of a case accommodating members constituting the illumination device 4.

The display surface 2A of the display panel 2 is a concave surface. In an example, a bus GN of the display surface 2A is parallel to the second direction Y. The flexible wiring boards F1 and F2 are mounted on the concave display surface 2A at one end, and are mounted on the planar surface 3B at the other end. Since the display panel 2 and the circuit board 3 face each other in the third direction Z, the flexible wiring boards F1 and F2 have bend portions BA1 and BA2, respectively. In other words, the flexible wiring boards F1 and F2 have curvatures at the bend portions BA1 and BA2, respectively.

Figure 3:
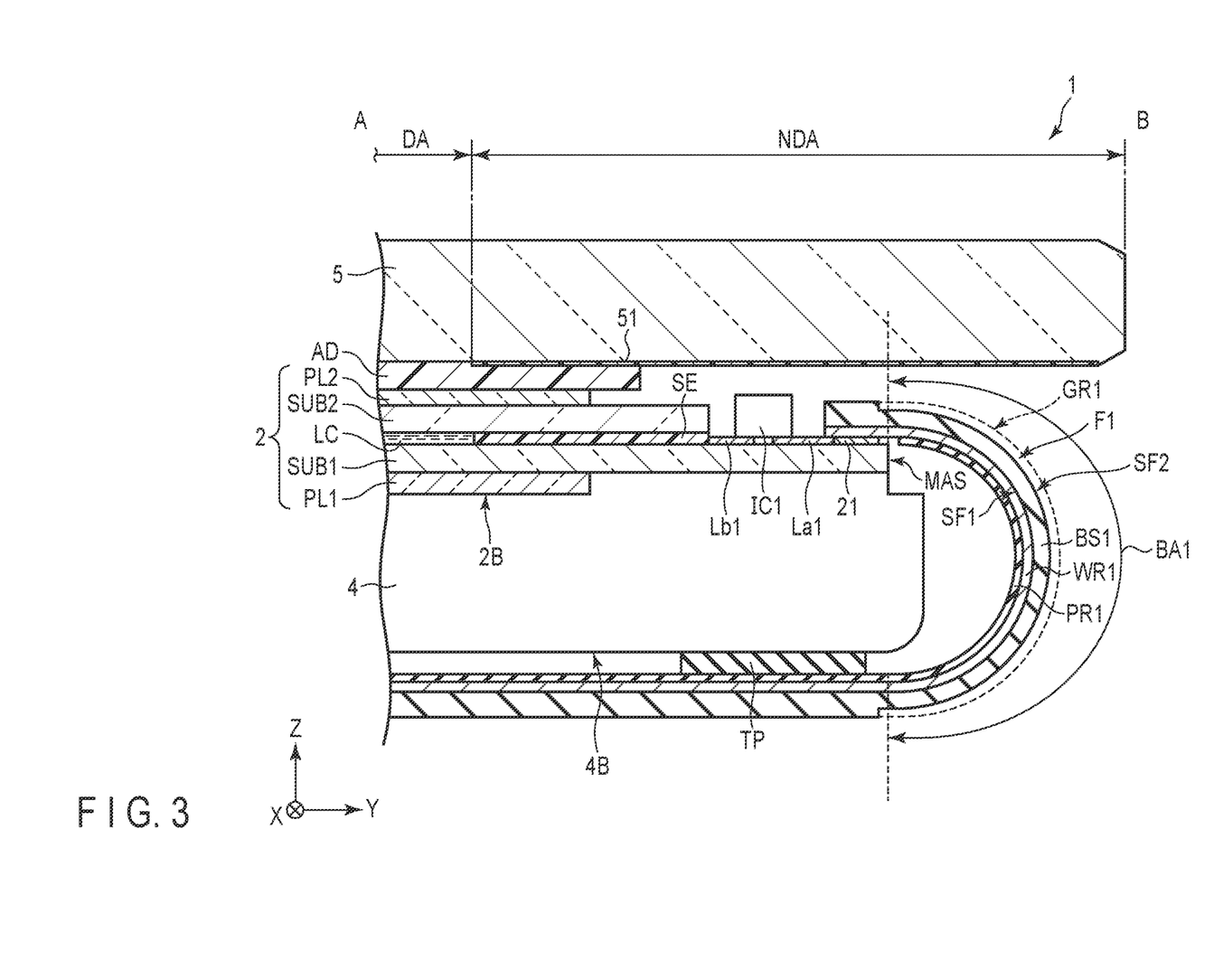
FIG. 3 is a cross-sectional view of the display device 1 taken along line A-B illustrated in FIG. 1.

FIG. 3 is a cross-sectional view of the display device 1 taken along line A-B illustrated in FIG. 1. FIG. 3 illustrates a plane parallel to a Y-Z plane defined by the second direction Y and the third direction Z. In the illustrated example, the display device 1 includes a cover member 5 in addition to the above configuration.

The cover member 5 is bonded to the display panel 2 by an adhesive AD. The cover member 5 is made of, for example, glass or acrylic transparent resin. The cover member 5 includes a light-shielding layer 51 located in the non-display region NDA. The light-shielding layer 51 is located on the lower surface of the cover member 5, and part thereof is in contact with the adhesive AD. Note that the light-shielding layer 51 may be formed on the upper surface of the cover member 5. Although not illustrated, the light-shielding layer 51 is formed in a frame shape at the peripheral edge of the cover member 5.

Display panel 2 includes a liquid crystal layer LC, a sealing member SE, wires La1, wires Lb1, a first polarizer PL1, and a second polarizer PL2 in addition to the first substrate SUB1 and the second substrate SUB2. Liquid crystal layer LC is located in an inner region surrounded by the sealing member SE between the first substrate SUB1 and the second substrate SUB2. The wires La1 extend from the IC chip IC1 toward the mounting side MAS side and is connected to the pad 21. That is, the wires La1 electrically connect the IC chip IC1 and the flexible wiring board F1. The wires Lb1 extend from the IC chip IC1 toward the display region DA side, and electrically connects the IC chip IC1 and a signal line (not illustrated) disposed in the display region DA. The first polarizer PL1 is bonded to the lower surface of the first substrate SUB1. Second polarizer PL2 is bonded to the upper surface of second substrate SUB2.

Although the detailed configuration of the display panel 2 will not be described here, the display panel 2 may have any configuration in accordance with a display mode using a lateral electric field along the main surface of the substrate, a display mode using a longitudinal electric field along a normal line of the main surface of the substrate, a display mode using an inclined electric field inclined in an oblique direction with respect to the main surface of the substrate, and a display mode using the lateral electric field, the longitudinal electric field, and the inclined electric field in an appropriate combination.

The flexible wiring board F1 includes a base member BS1, wires WR1, and a protective layer PR1 covering the wires WR1. The base member BS1 has a surface SF1 facing the illumination device 4 and a surface SF2 opposite to the surface SF1. In an example, the wires WR1 are located on the surface SF1 side. The base member BS1 and the protective layer PR1 are formed of, for example, a synthetic resin such as polyimide or polyurethane. The wires WR1 are each formed of, for example, a copper foil.

The flexible wiring board F1 is bent such that the protective layer PR1 faces the display panel 2 and the illumination device 4. That is, the protective layer PR1 is located at the inner periphery side of the bend portion BA1, and the base member BS1 is located at the outer periphery side of the bend portion BA1. The flexible wiring board F1 is electrically connected to and bonded to the display panel 2 by an anisotropic conductive film, which is a conductive material. That is, an anisotropic conductive film (not illustrated) is interposed between the pad 21 and the wires WR1. The flexible wiring board F1 is fixed to the lower surface 4B of the illumination device 4 by a double-faced tape TP.

In the illustrated example, the base member BS1 has a groove GR1 located in the bend portion BA1. In an example, the groove GR1 is formed at the surface SF2 and does not penetrate the base member BS1. Such a groove GR1 is formed by, for example, laser processing. As illustrated in the drawing, the groove GR1 may be formed at the outer part of the bend portion BA1. By forming such a groove GR1, the flexible wiring board F1 is thinned at the bend portion BA1, so that the rigidity of the flexible wiring board F1 is reduced, and the flexible wiring board F1 can be easily bent.

Figure 4:
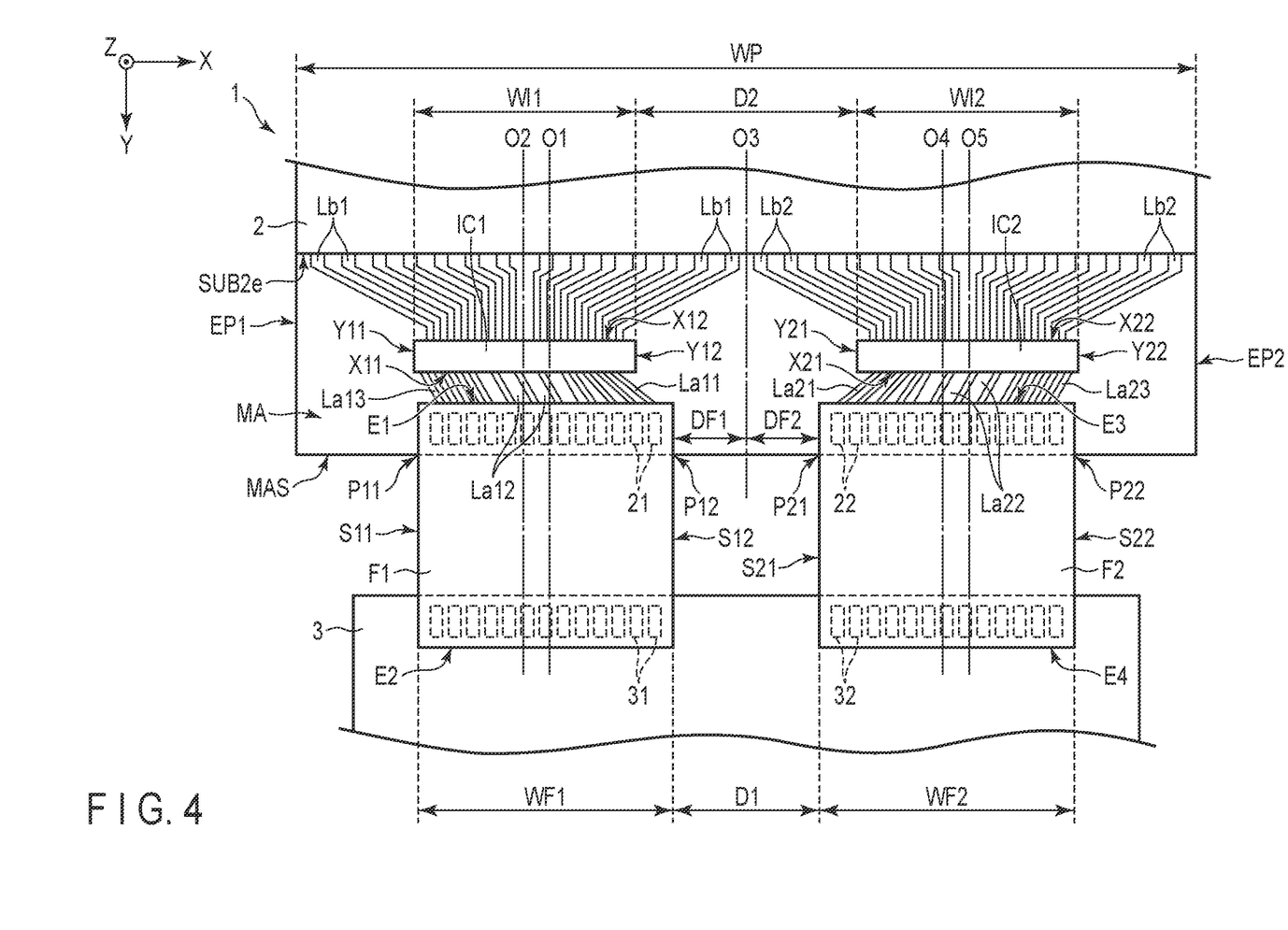
FIG. 4 is a plan view illustrating the display device 1 in a developed manner.

FIG. 4 is a plan view illustrating the display device 1 in a developed manner. FIG. 4 illustrates a plane parallel to an X-Y plane defined by the first direction X and the second direction Y. In the present embodiment, the mounting side MAS is parallel to the first direction X in plan view. The pads 21 and 22 are disposed along the first direction X. The center O3 of the display panel 2 coincides with the center of the mounting side MAS as indicated by a dot-and-dash line in the drawing.

The flexible wiring board F1 has an end portion (first end portion) E1 and an end portion (second end portion) E2 opposite to the end portion E1. The above-described bend portion BA1 is located between the end portion E1 and the end portion E2. The flexible wiring board F1 is mounted on the display panel 2 at the end portion E1 side, and is mounted on the circuit board 3 at the end portion E2 side. More specifically, the flexible wiring board F1 overlaps the pad 21 at the end portion E1 side, and overlaps, at the end portion E2 side, a pad 31 provided on the circuit board 3. In addition, the flexible wiring board F1 has a side edge S11 extending from the end portion E1 to the end portion E2, and a side edge S12 opposite to the side edge S11 and extending from the end portion E1 to the end portion E2. In the illustrated example, the side edge S11 is located toward the end portion EP1, and the side edge S12 is located toward the center O3.

The flexible wiring board F2 has an end portion (third end portion) E3 and an end portion (fourth end portion) E4 opposite to the end portion E3. The above-described bend portion BA2 is located between the end portion E3 and the end portion E4. The flexible wiring board F2 is mounted on the display panel 2 at the end portion E3 side, and is mounted on the circuit board 3 at the end portion E4 side. More specifically, the flexible wiring board F2 overlaps the pad 22 at the end portion E3 side, and overlaps, at the end portion E4 side, a pad 32 provided on the circuit board 3. In addition, the flexible wiring board F2 has a side edge S21 extending from the end portion E3 to the end portion E4, and a side edge S22 opposite to the side edge S21 and extending from the end portion E3 to the end portion E4. In the illustrated example, the side edge S21 is located toward the center O3, and the side edge S22 is located toward the end portion EP2.

In the illustrated example, the pads 21, 22, 31, and 32 have a substantially rectangular shape and extend along the second direction Y. The wires WR1 illustrated in FIG. 1 is connected to the pad 21 at the end portion E1 side, and is connected to the pad 31 at the end portion E2 side.

The wires WR2 illustrated in FIG. 1 is connected to the pad 22 at the end portion E3 and is connected to the pad 32 at the end portion E4.

The IC chip IC1 has a shape elongated in the first direction X in an example, and has a substantially rectangular shape in the illustrated example. That is, the IC chip IC1 has end portions X11 and X12 extending along the first direction X and end portions Y11 and Y12 extending along the second direction Y. The end portion X11 faces the flexible wiring board F1, and the end portion X12 faces the end portion SUB2e of the second substrate SUB2. The end portion Y11 faces the end portion EP1, and the end portion Y12 faces the IC chip IC2.

The IC chip IC2 has a shape elongated in the first direction X in an example, and has a substantially rectangular shape in the illustrated example. That is, the IC chip IC2 has end portions X21 and X22 extending along the first direction X and end portions Y21 and Y22 extending along the second direction Y. The end portion X21 faces flexible wiring board F2, and the end portion X22 faces the end portion SUB2e of the second substrate SUB2. The end portion Y21 faces the IC chip IC1, and the end portion Y22 faces the end portion EP2.

In the present embodiment, the center (first center) O1 of the flexible wiring board F1 is closer to the center O3 than the center (second center) O2 of the IC chip IC1.

Here, the center O1 is a center position of the flexible wiring board F1 with respect to a width WF1 in the first direction X as indicated by a dot-and-dash line in the drawing. The width WF1 is defined at a position where the flexible wiring board F1 overlaps the mounting side MAS in plan view. That is, the width WF1 corresponds to a distance in the first direction X from an intersection point P11 between the side edge S11 and the mounting side MAS to an intersection point P12 between the side edge S12 and the mounting side MAS. Therefore, the center O1 is located at an equal distance from the intersection point P11 and the intersection point P12.

The center O2 is a center position of the IC chip IC1 with respect to a width WI1 in the first direction X as indicated by a dot-and-dash line in the drawing. The width WI1 is defined as a distance between the end portion Y11 and the end portion Y12 in the first direction X. Here, the end portion Y11 is an end portion, of the IC chip IC1, closest to the end portion EP1, and the end portion Y12 is an end portion, of the IC chip IC1, closest to the end portion EP2. The center O2 is located at an equal distance from the end portion Y11 and the end portion Y12. In an example, the width WI1 is smaller than the width WF1.

In the present embodiment, the center (fourth center) O4 of the flexible wiring board F2 is closer to the center O3 than the center (fifth center) O5 of the IC chip IC2.

Here, the center O4 is a center position of the flexible wiring board F2 with respect to a width WF2 in the first direction X as indicated by a dot-and-dash line in the drawing. The width WF2 is defined at a position where the flexible wiring board F2 overlaps the mounting side MAS in plan view. That is, the width WF2 corresponds to a distance in the first direction X from an intersection point P21 between the side edge S21 and the mounting side MAS to an intersection point P22 between the side edge S22 and the mounting side MAS. Therefore, the center O4 is located at an equal distance from the intersection point P21 and the intersection point P22.

The center O5 is a center position of the IC chip IC2 with respect to a width WI2 in the first direction X as indicated by a dot-and-dash line in the drawing. The width WI2 is defined as a distance between the end portion Y21 and the end portion Y22 in the first direction X. Here, the end portion Y21 is an end portion, of the IC chip IC2, closest to the end portion EP1, and the end portion Y22 is an end portion, of the IC chip IC2, closest to the end portion EP2. The center O2 is located at an equal distance from the end portion Y21 and the end portion Y22. In an example, the width WI2 is smaller than the width WF2.

In the illustrated example, the flexible wiring boards F1 and F2 have substantially square shapes having substantially the same size, but the shapes of the flexible wiring boards F1 and F2 are not limited to the illustrated example. The flexible wiring boards F1 and F2 may have a polygonal shape other than a quadrangle shape, may include a curved line, or may not have a symmetrical shape with respect to the first direction X and the second direction Y. Further, the sizes of the flexible wiring boards F1 and F2 may be different. In any case, the centers O1 and O4 can be defined by defining the widths WF1 and WF2 as described above.

In addition, the shapes of the IC chips IC1 and IC2 are not limited to the illustrated example. For example, the end portions Y11, Y12, Y21, and Y22 may include curves. Alternatively, the IC chips IC1 and IC2 may be disposed to be inclined with respect to the first direction X. In any case, the centers O2 and O5 can be defined by defining the widths WI1 and WI2 as described above.

In the illustrated example, the flexible wiring board F1 and the flexible wiring board F2 have substantially the same size and the same shape, and are disposed symmetrically with respect to the center O3 in the first direction X. That is, a distance DF1 between the flexible wiring board F1 and the center O3 is equal to a distance DF2 between the flexible wiring board F2 and the center O3. Here, the distance DF1 is a distance between the side edge S12 and the center O3 in the first direction X, and the distance DF2 is a distance between the side edge S21 and the center O3 in the first direction X. The distances DF1 and DF2 are, for example, 2.5 mm or more and ¼ or less of the width WP of the display panel 2. The flexible wiring board F1 and the flexible wiring board F2 are preferably close to the center O3 with, but when the flexible wiring board F1 and the flexible wiring board F2 are too close to each other, the flexible wiring board F1 and the flexible wiring board F2 may overlap each other in the vicinity of the center O3. It is not preferable that the flexible wiring board F1 and the flexible wiring board F2 overlap each other at the time of bending, and the distance DF1 and the distance DF2 are set to 2.5 mm in the present embodiment so that the flexible wiring board F1 and the flexible wiring board F2 do not overlap each other in the vicinity of the center O3.

Furthermore, in the illustrated example, the IC chip IC1 and the IC chip IC2 have the same size and the same shape, and are disposed symmetrically with respect to the center O3 in the first direction X. Since the centers O1 and O4 are closer to the center O3 than the centers O2 and O5 and the widths WF1 and WF2 are larger than the widths WI1 and WI2, respectively, a distance D1 between the flexible wiring board F1 and the flexible wiring board F2 is smaller than a distance D2 between the IC chip IC1 and the IC chip IC2. Here, the distances D1 and D2 are distances in the first direction X.

The display panel 2 includes, on the mounting portion MA, a plurality of wires La1 (La11, La12, La13) connected to the end portion X11 of the IC chip IC1 and a plurality of wires Lb1 connected to the end portion X12 of the IC chip IC1. In addition, the display panel 2 includes, on the mounting portion MA, a plurality of wires La1 (La21, La22, La23) connected to the end portion X21 of the IC chip IC2 and a plurality of wires Lb2 connected to the end portion X22 of the IC chip IC2.

The wire (first wire) wire La11 among the wires La1 is closest to the center O3. The wire La13 among the wires La1 is farthest away from the center O3. The wires (second wire) La12 are located between the wire La11 and the wire La13 and each has a width larger than the widths of the wires La11 and La13. Here, the width is a width in the first direction X. In the illustrated example, four wires La12 are disposed. The wires La11, La12, and La13 extend in an inclined manner with respect to the second direction Y such that the end portion toward the flexible wiring board F1 is closer to the center O3 than the end portion toward the IC chip IC1. In the illustrated example, the inclination of the wire La11 is larger than the inclination of the wires La12 and La13. Therefore, in the present embodiment, the length of the wire La11 and the length of the wires La12 are different. That is, since the center O1 is closer to the center O3 than the center O2 and the width WF1 is larger than the width WI1, the wire La11 located toward the center O3 is longer than the wires La12.

In an example, the wire La11 and the wire La13 are data lines that supplies an image signal. In an example, the wires La12 are each a power supply line that supplies a reference electric potential for driving. In the illustrated example, the lengths of the wires La12 and the wire La13 are substantially equal. However, when the width WF1 of the flexible wiring board F1 is sufficiently larger than the width WI1 of the IC chip IC1, the length of the wire La13 can be larger than the length of the wires La12. Therefore, by using the wires La12 as the power supply line and using the wires La11 and La13 as the data lines, it is possible to suppress the extension of the power supply line even when the positions of the center O1 and the center O2 in the first direction X are shifted. In other words, it is possible to suppress an increase in resistance of the power supply line. In general, the resistance of the power supply line that supplies the reference electric potential is desirably as small as possible in order to prevent a drop in the supplied electric potential. Therefore, with the arrangement as described above, it is possible to suppress an increase in resistance of the power supply line and to supply a stable electric potential.

In the illustrated example, the wires La21, La22, and La23 are respectively disposed symmetrically as the wires La11, La12, and La13 with respect to the center O3. That is, the wire La21 among the wires La1 is closest to the center O3, the wire La23 among the wires La1 is farthest away from the center O3, and the wires La22 are located between the wire La21 and the wire La23. The width of each of the wires La22 in the first direction X is larger than the widths of the wire La21 and La23 in the first direction X. The wires La21, La22, and La23 extend in an inclined manner with respect to the second direction Y such that the end portion toward the flexible wiring board F2 is closer to the center O3 than the end portion toward the IC chip IC2. The inclination of the wire La21 is larger than the inclination of the wires La22 and La23. The wire La21 is longer than the wires La22 and La23. The wires La21 and La23 are data lines, and the wires La22 are each a power supply line. With such an arrangement, as in the case of the wires La1, it is possible to suppress an increase in the resistance of the power supply line and to suppress a drop in the electric potential supplied to the power supply line. Therefore, the difference between the electric potential of the wires La22 and the electric potential of the wires La12 can be reduced.

Each of the wires Lb1 and Lb2 is connected to a signal line (not illustrated) disposed in the display region DA. A distance between the wires Lb1 adjacent to each other at the end portion SUB2e is larger than a distance between the wires Lb1 adjacent to each other at the end portion X12. A distance between the wires Lb2 adjacent to each other at the end portion SUB2e is larger than a distance between the wires Lb2 adjacent to each other at the end portion X22. A distance between the adjacent wires Lb1, a distance between the adjacent wires Lb2, and a distance between the adjacent wires Lb1 and Lb2 at the end portion SUB2e are substantially equal. In the illustrated example, the wires Lb1 are disposed symmetrically with respect to the center O2, and the wires Lb2 are disposed symmetrically with respect to the center O5.

Figure 5:
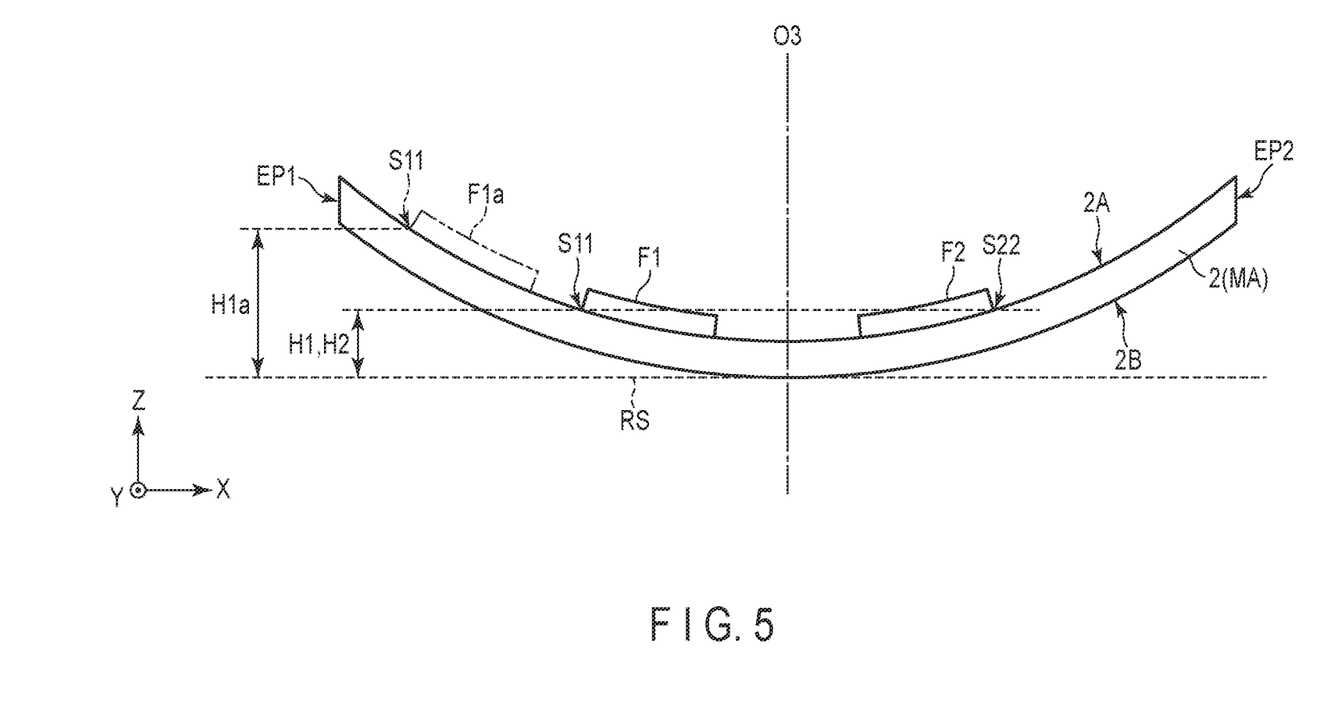
FIG. 5 is a cross-sectional view illustrating an example of a mounting portion MA.

FIG. 5 is a cross-sectional view illustrating an example of the mounting portion MA. FIG. 5 illustrates a plane parallel to the X-Z plane. Hereinafter, the position of the surface 2B in the third direction Z at the center O3 is referred to as a reference plane RS. Further, a distance from the reference plane RS in the third direction Z is referred to as a height. The reference plane RS is parallel to the X-Y plane. In other words, the reference plane RS is parallel to the surfaces 3A and 3B of the circuit board 3 illustrated in FIGS. 1 and 2.

In the present embodiment, since the display surface 2A is a concave surface, the height of the display surface 2A is the smallest at the center O3 and increases as the distance from the center O3 increases. Therefore, the heights H1 and H2 of the flexible wiring boards F1 and F2 mounted on the display surface 2A also increase as the mounting position moves away from the center O3. Here, the heights H1 and H2 are each the height of the boundary between the side edge away from the center O3 and the display surface 2A. That is, the height H1 corresponds to the height of the boundary between the side edge S11 toward the end portion EP1 and the display surface 2A, and the height H2 corresponds to the height of the boundary between the side edge S22 toward the end portion EP2 and the display surface 2A. In the illustrated example, the height H1 and the height H2 are equal. When display surface 2A is a flat surface, that is, when display panel 2 is not curved, heights H1 and H2 are equal to each other, and each correspond to the thickness of first substrate SUB1.

FIG. 5 illustrates, as a flexible wiring board F1a by a two-dot chain line, the flexible wiring board F1 in a case where the flexible wiring board F1 is disposed farther away from the center O3 than the flexible wiring board F1 of the present embodiment. The height H1 is smaller than the height H1a of the flexible wiring board F1a. Further, the flexible wiring board F1 has a smaller inclination with respect to the reference plane RS than the flexible wiring board F1a. Here, the inclination is defined as, for example, a tangent line of the display surface 2A at the boundary between the side edge S11 and the display surface 2A.

According to the present embodiment, by bringing the flexible wiring boards F1 and F2 mounted on the curved mounting portion MA close to the center O3 of the mounting portion MA, as described with reference to FIG. 5, the heights H1 and H2 from the reference plane RS, which is a plane, can be reduced. In other words, the flexible wiring boards F1 and F2 can be mounted in a state close to a plane at the end portions E1 side and E2 side. Therefore, even when the end portions E2 and E4 are mounted on the plate-like circuit board 3, it is possible to reduce twisting of the flexible wiring boards F1 and F2 due to being connected to both the curved surface and the flat surface. As a result, it is possible to reduce the stress of the flexible wiring boards F1 and F2 when the flexible wiring boards F1 and F2 are bent. As a result, separation of the flexible wiring boards F1 and F2 from the mounting portion MA and the circuit board 3, breakage of the wires WR1 and WR2, and the like can be suppressed, and reliability of the display device 1, which is an electronic device, can be improved.

Figure 6:
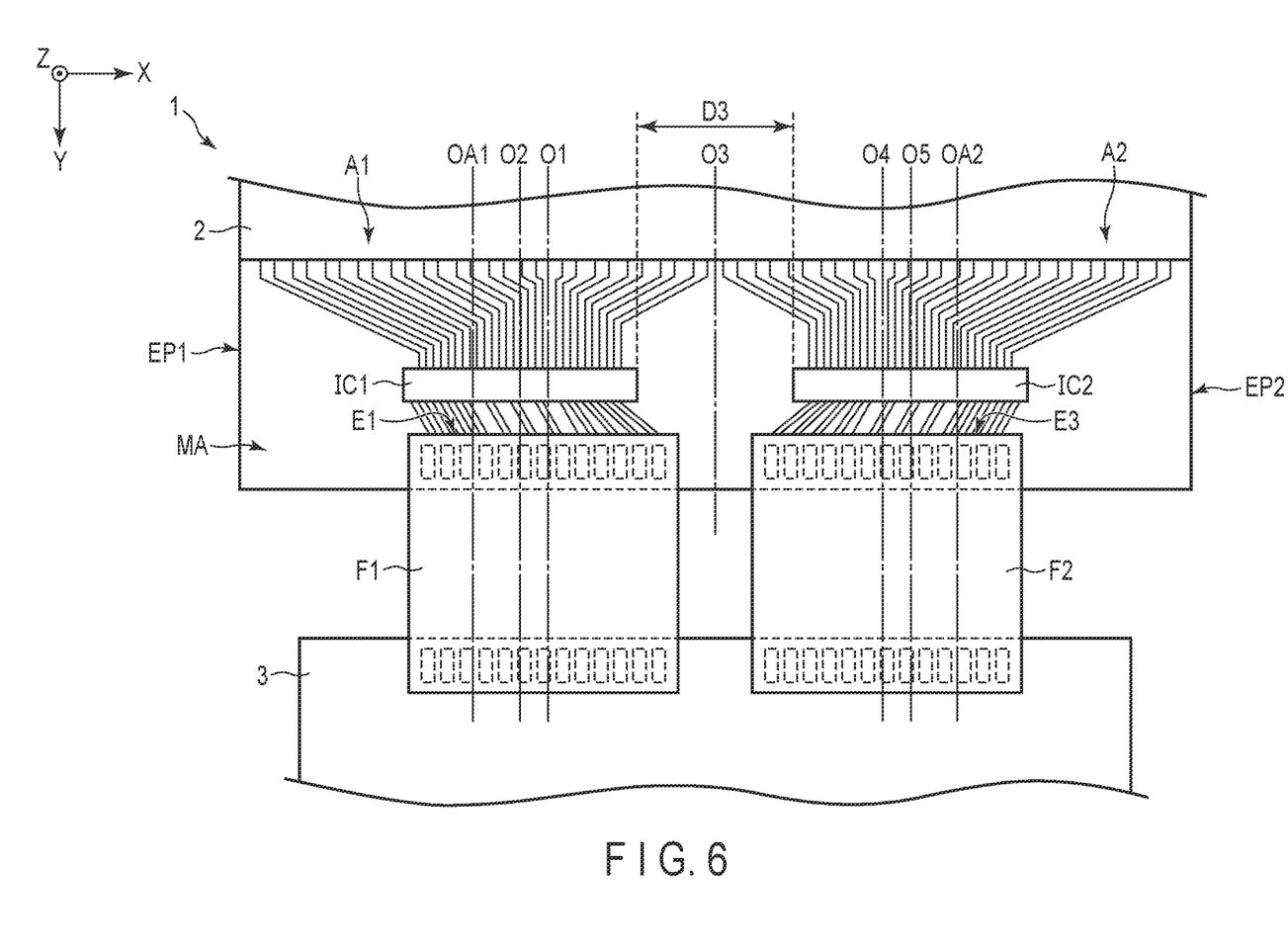
FIG. 6 is a plan view illustrating another example of the display device 1.

FIG. 6 is a plan view illustrating another example of the display device 1. The example illustrated in FIG. 6 is different from the example illustrated in FIG. 4 in that each of the IC chips IC1 and IC2 is close to the center O3 in the first direction X. In other words, a distance D3 between the IC chip IC1 and the IC chip IC2 in the first direction X is smaller than the distance D2 illustrated in FIG. 4. In the illustrated example, the center O2 is closer to the center O3 than the center OA1 of a half region A1 of the display panel 2, and the center O5 is closer to the center O3 than the center OA2 of a half region A2 of the display panel 2. Here, the region A1 is a region of the display panel 2 toward the end portion EP1 and corresponds to a region between the end portion EP1 and the center O3. The region A2 is a region of the display panel 2 toward the end portion EP2 and corresponds to a region between the end portion EP2 and the center O3. The centers OA1 and 0A2 are center positions with respect to the widths of the regions A1 and A2 in the first direction X, respectively.

Also in the example illustrated in FIG. 6, the center O1 is closer to the center O3 than the center O2, and the center O4 is closer to the center O3 than the center O5. Therefore, in the example illustrated in FIG. 6, the flexible wiring boards F1 and F2 are closer to the center O3 than those in the example illustrated in FIG. 4. Therefore, the flexible wiring boards F1 and F2 can be mounted in a state in which they are closer to the plane at the end portions E1 side and E3 side. As a result, the stress at the time of bending the flexible wiring boards F1 and F2 can be further reduced, and reliability of the display device 1 can be improved.

Figure 7:
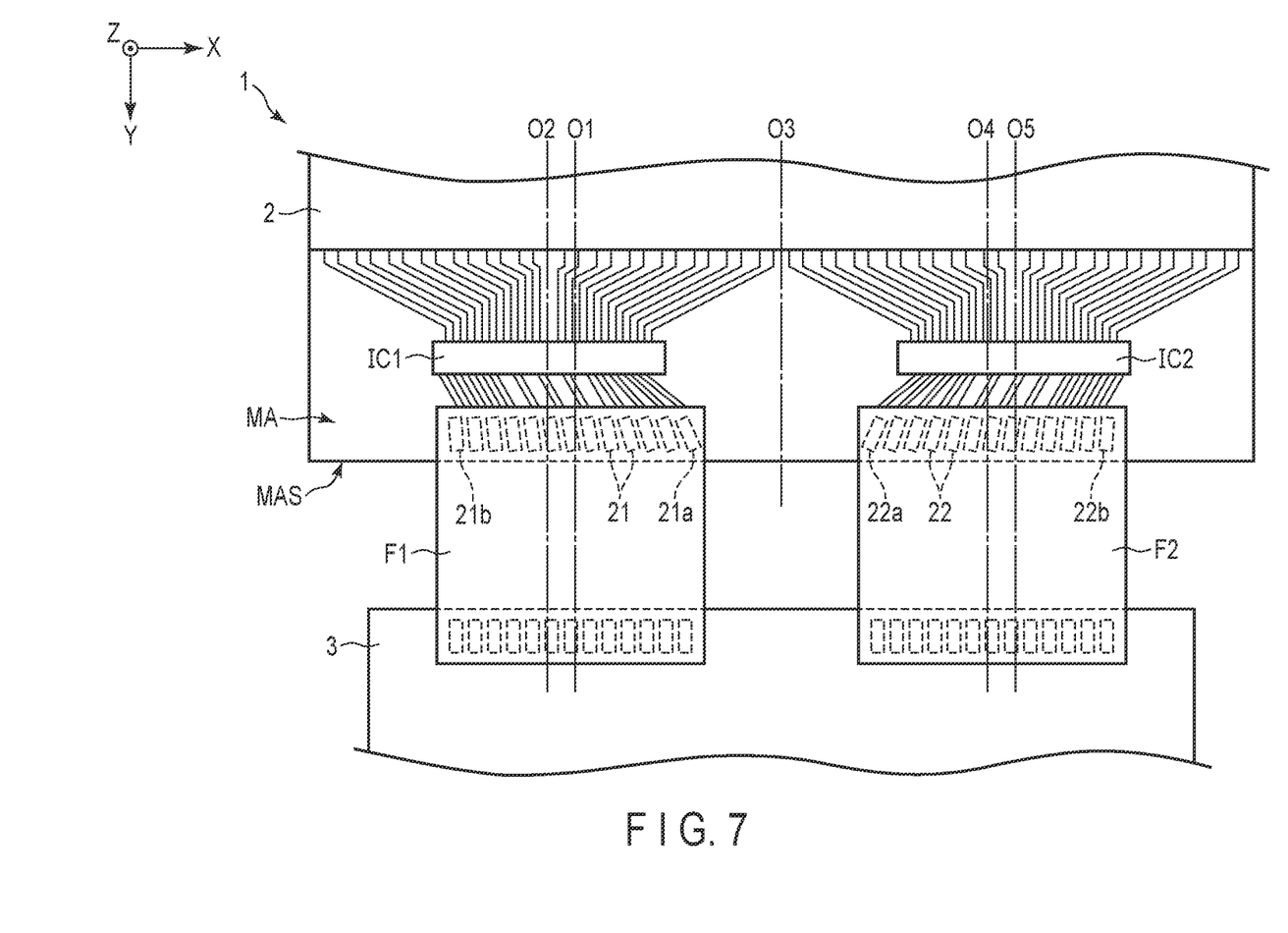
FIG. 7 is a plan view illustrating another example of the display device 1.

FIG. 7 is a plan view illustrating another example of the display device 1. The example illustrated in FIG. 7 is different from the example illustrated in FIG. 4 in that the extending direction of each of the pad 21 and the pad 22 intersects the second direction Y. More specifically, the pads 21 are inclined such that the end portion toward the mounting side MAS is closer to the center O3 than the end portion toward the IC chip IC1. In the illustrated example, a pad 21$a$ closest to the center O3 among the pads 21 has a larger inclination than a pad 21$b$ farthest away from the center O3 among the pads 21. In addition, the pads 22 are inclined such that the end portion toward the mounting side MAS is closer to the center O3 than the end portion toward the IC chip IC2. In the illustrated example, a pad 22$a$ closest to the center O3 among the pads 22 has a larger inclination than a pad 22$b$ farthest away from the center O3 among the pads 22.

Also in the example illustrated in FIG. 7, since the centers O1 and O4 are closer to the center O3 than the centers O2 and O5, respectively, an effect similar to that in the example illustrated in FIG. 4 can be obtained. Furthermore, according to the example illustrated in FIG. 7, the pads 21 are inclined in the same direction as the wires La1 with respect to the second direction Y, and the pads 22 are inclined in the same direction as the wires La1. In general, in the flexible wiring board, when the extending direction of the wiring is orthogonal to the bending axis, the stress of the wiring is maximized, and when the extending direction of the wiring is parallel to the bending axis, the stress of the wiring is minimized. In the example illustrated in FIG. 7, since the angle formed by the extending direction of the pads 21 and 22 and the bending axis (not illustrated) of the flexible wiring boards F1 and F2 can be reduced, the stress of the pads 21 and 22 when the flexible wiring boards F1 and F2 are bent can be reduced. As a result, breakage of the wires WR1 in the vicinity of the pad 21 and breakage of WR2 in the vicinity of the pad 22 can be suppressed, and reliability of the display device 1 can be improved.

Figure 8:
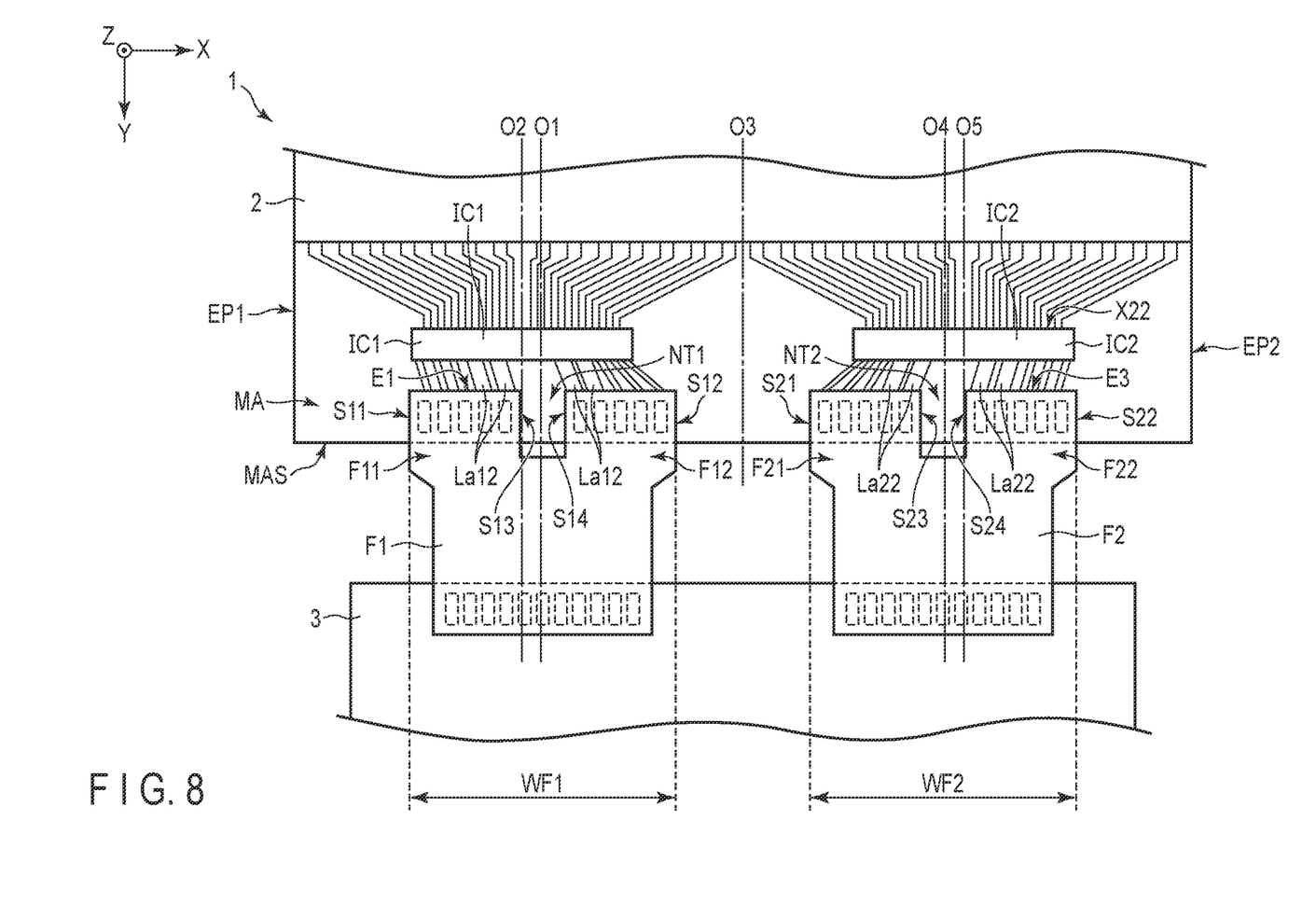
FIG. 8 is a plan view illustrating another example of the display device 1.

FIG. 8 is a plan view illustrating another example of the display device 1. The example illustrated in FIG. 8 is different from the example illustrated in FIG. 4 in that the flexible wiring boards F1 and F2 have notches NT1 and NT2 overlapping with the mounting portion MA, respectively.

The notches NT1 and NT2 are provided at the end portions E1 and E3, respectively, and are substantially rectangular in the illustrated example. Since the notch NT1 is provided, the flexible wiring board F1 is divided into two portions F11 and F12 overlapping the mounting portion MA at the end portion E1 side. The flexible wiring board F1 has side edges S13 and S14 extending along the second direction Y between the side edge S11 and the side edge S12, respectively. In addition, since the notch NT2 is provided, the flexible wiring board F2 is divided into two portions F21 and F22 overlapping the mounting portion MA at the end portion E3 side. The flexible wiring board F2 has side edges S23 and S24 extending along the second direction Y between side edge S21 and the side edge S22, respectively.

In an example, the notches NT1 and NT2 each overlap the mounting side MAS. That is, the side edges S13, S14, S23, and S24 intersects the mounting side MAS. In the illustrated example, the notches NT1 and NT2 are provided at the centers of the flexible wiring boards F1 and F2, respectively, in the first direction X. In other words, the side edges S13 and S14 are located equidistant from the center O1, and the side edges S23 and S24 are located equidistant from the center O4.

The wires La12 and La22, which are power supply lines, are disposed in the vicinity of the notches NT1 and NT2. In the illustrated example, the wires La12 toward the end portion EP1 are connected to a portion F11, and the wires La12 toward the end portion EP2 are connected to a portion F12. The wires La22 toward the end portion EP1 are connected to a portion F21, and the wires La22 toward the end portion EP2 are connected to a portion F22.

In the illustrated example, the widths of the flexible wiring boards F1 and F2 overlapping the circuit board 3 are smaller than the widths of the flexible wiring boards F1 and F2 overlapping the mounting portion MA, respectively. Even in such a case, the centers O1 and O4 can be defined by defining the widths WF1 and WF2 of the flexible wiring boards F1 and F2 as the widths in the first direction X at the position overlapping the mounting side MAS, respectively.

Also in the example illustrated in FIG. 8, since the centers O1 and O4 are closer to the center O3 than the centers O2 and O5, respectively, an effect similar to that in the example illustrated in FIG. 4 can be obtained. Furthermore, according to the example illustrated in FIG. 8, in the region overlapping the mounting portion MA, the notches NT1 and NT2 are provided in the flexible wiring boards F1 and F2, and the flexible wiring boards F1 and F2 are divided into the portion F11 and the portion F12, and the portion F21 and the portion F22, respectively. Therefore, in the mounting portion MA, the flexible wiring boards F1 and F2 can be easily deformed along the curved surface shape of the mounting portion MA. That is, the stress of the flexible wiring boards F1 and F2 can be reduced, and reliability of the display device 1 can be improved.

Figure 9:
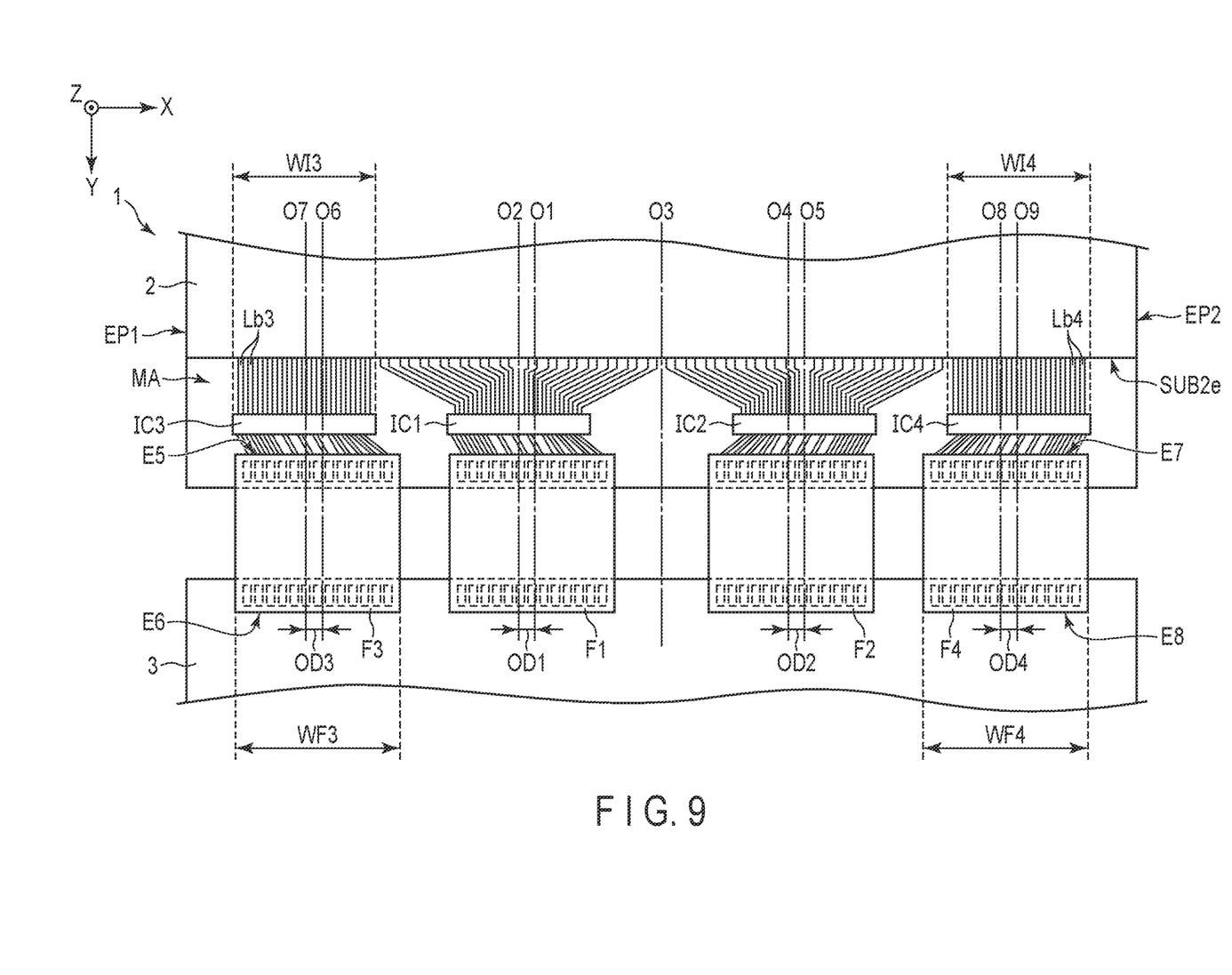
FIG. 9 is a plan view illustrating another example of the display device 1.

FIG. 9 is a plan view illustrating another example of the display device 1. The example illustrated in FIG. 9 is different from the example illustrated in FIG. 4 in that the display device 1 further includes an IC chip (third IC chip) IC3, an IC chip (fourth IC chip) IC4, a flexible wiring board (third flexible wiring board) F3, and a flexible wiring board (fourth flexible wiring board) F4.

The IC chip IC3 is located between the IC chip IC1 and the end portion EP1 in the first direction X. The IC chip IC4 is located between the IC chip IC2 and the end portion EP2 in the first direction X. In an example, the IC chips IC3 and IC4 have a function of a shift register. Wires Lb3 connected to the IC chip IC3 and extending toward the end portion SUB2e and wires Lb4 connected to the IC chip IC4 and extending toward the end portion SUB2e are electrically connected to a scanning line (not illustrated) disposed in the display region DA, for example.

The flexible wiring board F3 is located between the flexible wiring board F1 and the end portion EP1 in the first direction X. The flexible wiring board F3 electrically connects the IC chip IC3 and the circuit board 3. That is, the flexible wiring board F3 has an end portion (fifth end portion) E5 mounted on the mounting portion MA and an end portion (sixth end portion) E6 opposite to the end portion E5 and mounted on the circuit board 3. The flexible wiring board F4 is located between the flexible wiring board F2 and the end portion EP2 in the first direction X. The flexible wiring board F4 electrically connects the IC chip IC4 and the circuit board 3. That is, the flexible wiring board F4 has an end portion (seventh end portion) E7 mounted on the mounting portion MA and an end portion (eighth end portion) E8 opposite to the end portion E7 and mounted on the circuit board 3.

The center (sixth center) O6 of the flexible wiring board F3 is closer to the center O3 than the center (seventh center) O7 of the IC chip IC3. The center O6 is a center position of the flexible wiring board F3 with respect to a width WF3 in the first direction X, and the center O7 is a center position of the IC chip IC3 with respect to a width WI3 in the first direction X. In addition, the center (eighth center) O8 of the flexible wiring board F4 is closer to the center O3 than the center (ninth center) O9 of the IC chip IC4. The center O8 is a center position of the flexible wiring board F4 with respect to a width WF4 in the first direction X, and the center O9 is a center position of the IC chip IC4 with respect to a width WI4 in the first direction X. The widths WF3 and WF4 are defined similarly to the widths WF1 and WF2 described above, respectively. The widths WI3 and WI4 are defined similarly to the widths WI1 and WI2 described above, respectively. In the illustrated example, the widths WF3 and WF4 are larger than the widths WI3 and WI4, respectively.

In the illustrated example, in the first direction X, a distance DO1 between the center O1 and the center O2, a distance DO2 between the center O4 and the center O5, a distance DO3 between the center O6 and the center O7, and a distance DO4 between the center O8 and the center O9 are equal. However, the centers O1, O4, O6, and O8 may be closer to the center O3 than the centers O2, O5, O7, and O9, respectively, and the distances DO1, DO2, DO3, and DO4 may be different from each other. In addition, the number of IC chips and the number of flexible wiring boards mounted on the mounting portion MA are not limited to the illustrated example, and may be three or five or more. Also in the example illustrated in FIG. 9, since the centers O1, O4, O6, and O8 are close to the center O3, an effect similar to that in the example illustrated in FIG. 4 can be obtained.

As described above, according to the present embodiment, it is possible to provide an electronic device capable of improving reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a panel including a curved display surface, a mounting portion curved along with a curved surface shape of the display surface, and a plurality of first pads disposed at intervals on the mounting portion in a first direction;
   a plate-like circuit board;
   a first flexible wiring board having a first end portion mounted on the plurality of first pads and a second end portion opposite to the first end portion and connected to the circuit board; and
   a first IC chip mounted on the mounting portion and electrically connected to the first flexible wiring board, wherein
   a first center of the first flexible wiring board in the first direction is closer to a third center of the panel in the first direction than a second center of the first IC chip in the first direction in plan view.

2. The electronic device according to claim 1, further comprising:
   a plurality of second pads disposed at intervals on the mounting portion in the first direction;
   a second flexible wiring board having a third end portion mounted on the plurality of second pads and a fourth end portion opposite to the third end portion and connected to the circuit board; and
   a second IC chip mounted on the mounting portion and electrically connected to the second flexible wiring board, wherein
   the third center is located between the first flexible wiring board and the second flexible wiring board, and wherein a fourth center of the second flexible wiring board in the first direction is closer to the third center than a fifth center of the second IC chip in the first direction in plan view.

3. The electronic device according to claim 2, further comprising:
   a third flexible wiring board having a fifth end portion mounted on the mounting portion and a sixth end portion opposite to the fifth end portion and connected to the circuit board;
   a fourth flexible wiring board having a seventh end portion mounted on the mounting portion and an eighth end portion opposite to the seventh end portion and connected to the circuit board;
   a third IC chip mounted on the mounting portion and electrically connected to the third flexible wiring board; and
   a fourth IC chip mounted on the mounting portion and electrically connected to the fourth flexible wiring board, wherein
   the first flexible wiring board is located between the third center and the third flexible wiring board, wherein
   the second flexible wiring board is located between the third center and the fourth flexible wiring board, and wherein
   a sixth center of the third flexible wiring board in the first direction is closer to the third center than a seventh center of the third IC chip in the first direction and an eighth center of the fourth flexible wiring board in the first direction is closer to the third center than a ninth center of the fourth IC chip in the first direction in plan view.

4. The electronic device according to claim 1, wherein a distance between the first center and the third center is 2.5 mm or more and ¼ or less of a width of the panel in the first direction in plan view.

5. The electronic device according to claim 1, further comprising:
   a first wire and a second wire that connect the first IC chip and the first flexible wiring board, wherein
   a length of the first wire is different from a length of the second wire.

6. The electronic device according to claim 5, wherein the first wire is a data line, wherein
   the second wire is a power supply line, and wherein
   the second wire is shorter than the first wire.

7. The electronic device according to claim 1, wherein the first flexible wiring board has a notch overlapping the mounting portion at the first end portion.

8. The electronic device according to claim 7, wherein the notch is provided at a center of the first flexible wiring board in the first direction.

9. The electronic device according to claim 1, wherein
   the first flexible wiring board has a bend portion between the first end portion and the second end portion, wherein
   the first flexible wiring board includes a base member located at an outer periphery of the bend portion, a protective layer located at an inner peripheral of the bend portion and covering the wires, and a wire between the base member and the protective layer, and wherein
   the base member includes a groove located at the bend portion and configured to reduce rigidity of the first flexible wiring board.

10. The electronic device according to claim 1, wherein the first pad is inclined such that one end portion of the first pad is closer to the third center than the other end portion of the first pad.

* * * * *